United States Patent
Tamura et al.

(10) Patent No.: US 7,884,605 B2
(45) Date of Patent: Feb. 8, 2011

(54) SHIM SUPPORT GUIDE JIG FOR MAGNETIC FIELD GENERATION APPARATUS, MAGNETIC FIELD GENERATION APPARATUS AND MAGNETIC RESONANCE IMAGING EQUIPMENT EACH INCLUDING SHIM SUPPORT IN WHICH MAGNETIC MATERIAL SHIMS ARE ARRANGED AND ADJUSTED BY EMPLOYING SHIM SUPPORT GUIDE JIG, AND MAGNETIC FIELD ADJUSTMENT METHOD FOR MAGNETIC FIELD GENERATION APPARATUS, AS WELL AS MAGNETIC FIELD ADJUSTMENT METHOD FOR MAGNETIC RESONANCE IMAGING EQUIPMENT

(75) Inventors: Hajime Tamura, Tokyo (JP); Hajime Tanabe, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 343 days.

(21) Appl. No.: 12/003,942

(22) Filed: Jan. 3, 2008

(65) Prior Publication Data
US 2009/0009171 A1  Jan. 8, 2009

(30) Foreign Application Priority Data
Jul. 6, 2007  (JP)  ............................. 2007-178540

(51) Int. Cl.
*G01V 3/00* (2006.01)
(52) U.S. Cl. ...................................... 324/318; 324/321
(58) Field of Classification Search ......... 324/318–322; 600/410, 411, 422, 423; 335/216, 301
See application file for complete search history.

(56) References Cited

U.S. PATENT DOCUMENTS

| | | | |
|---|---|---|---|
| 4,498,048 A * | 2/1985 | Lee et al. ..................... 324/309 |
| 4,580,098 A * | 4/1986 | Gluckstern et al. .......... 324/307 |
| 5,280,259 A * | 1/1994 | Idemaru et al. .............. 335/216 |
| 6,856,223 B1 * | 2/2005 | Takeshima et al. .......... 335/301 |
| 6,867,592 B2 * | 3/2005 | Gebhardt et al. ............. 324/318 |
| 7,030,610 B2 * | 4/2006 | Mansfield .................... 324/318 |
| 7,295,012 B1 * | 11/2007 | Lvovsky ..................... 324/320 |

(Continued)

FOREIGN PATENT DOCUMENTS

| | | |
|---|---|---|
| GB | 2 414 080 | 11/2005 |
| JP | 63-122441 A | 5/1988 |
| JP | 5-220127 A | 8/1993 |
| JP | 5-329128 A | 12/1993 |

OTHER PUBLICATIONS

An English Translation of the Notification of Reasons for Refusal in JP 2007-178540 dated May 26, 2009.

*Primary Examiner*—Melissa J Koval
*Assistant Examiner*—Tiffany A Fetzner
(74) *Attorney, Agent, or Firm*—Buchanan Ingersoll & Rooney PC

(57) ABSTRACT

A shim support guide jig includes a shim support guide pipe in which a guide passage for guiding the movement of a shim support is formed. In a state where a superconducting magnet has generated a static magnetic field, the designated shim support can be drawn out from the internal space of the superconducting magnet through the guide passage, and the designated shim support for which magnetic material shims have been arranged and adjusted can be inserted into the internal space through the guide passage. A magnetic field generation apparatus has the magnetic material shims arranged and adjusted using the shim support guide jig, and a magnetic resonance imaging equipment employs the magnetic field generation apparatus. Magnetic field adjustment methods for the magnetic field generation apparatus and for the magnetic resonance imaging equipment are performed using the shim support guide jig.

7 Claims, 5 Drawing Sheets

U.S. PATENT DOCUMENTS

| | | | |
|---|---|---|---|
| 7,508,209 B2 * | 3/2009 | Dietz et al. | 324/318 |
| 7,554,326 B2 * | 6/2009 | Sakakura | 324/318 |
| 2003/0155174 A1 * | 8/2003 | Mansfield | 181/207 |
| 2003/0206018 A1 * | 11/2003 | Gebhardt et al. | 324/318 |
| 2006/0262826 A1 * | 11/2006 | Dietz et al. | 372/96 |
| 2007/0252598 A1 * | 11/2007 | Lvovsky | 324/318 |
| 2007/0268021 A1 * | 11/2007 | Sakakura | 324/318 |
| 2009/0009171 A1 * | 1/2009 | Tamura et al. | 324/320 |

* cited by examiner

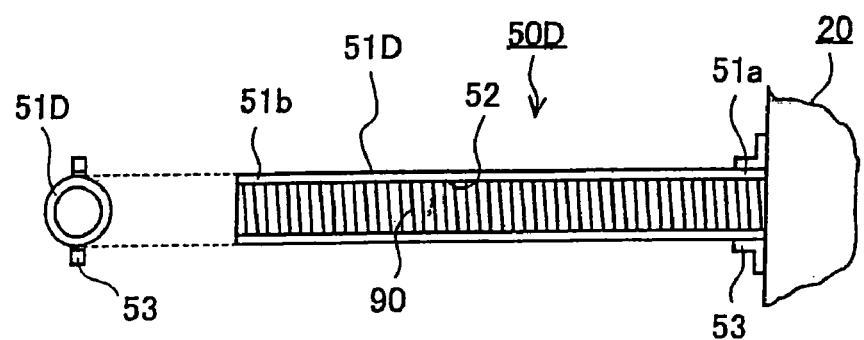
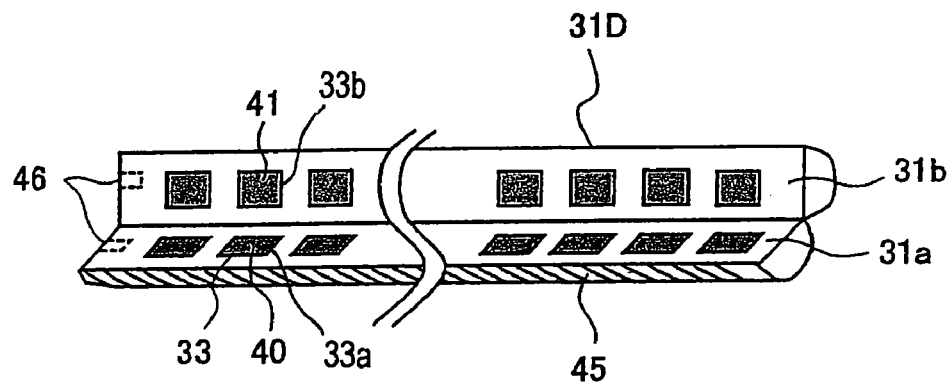

SHIM SUPPORT GUIDE JIG FOR MAGNETIC FIELD GENERATION APPARATUS, MAGNETIC FIELD GENERATION APPARATUS AND MAGNETIC RESONANCE IMAGING EQUIPMENT EACH INCLUDING SHIM SUPPORT IN WHICH MAGNETIC MATERIAL SHIMS ARE ARRANGED AND ADJUSTED BY EMPLOYING SHIM SUPPORT GUIDE JIG, AND MAGNETIC FIELD ADJUSTMENT METHOD FOR MAGNETIC FIELD GENERATION APPARATUS, AS WELL AS MAGNETIC FIELD ADJUSTMENT METHOD FOR MAGNETIC RESONANCE IMAGING EQUIPMENT

BACKGROUND OF THE INVENTION

1. Field of the Invention

This invention relates to a shim support guide jig for a magnetic field generation apparatus, a magnetic field generation apparatus and a magnetic resonance imaging equipment each including a shim support in which magnetic material shims are arranged and adjusted by employing a shim support guide jig, and a magnetic field adjustment method for a magnetic field generation apparatus, as well as a magnetic field adjustment method for a magnetic resonance imaging equipment.

2. Description of the Related Art

A magnetic field generation apparatus including a superconducting magnet is used in a magnetic resonance imaging equipment. The superconducting magnet is configured in a cylindrical shape, and it generates a static magnetic field in its internal space. A patient is arranged in the static magnetic field, and the image diagnosis of the patient is made.

A magnetic field whose magnetic field strength is high, which has a uniform magnetic field strength in the internal space, and which is of high temporal stability, is required of the static magnetic field. The superconducting magnet is used for generating such a static magnetic field. Concretely, it is required of the superconducting magnet for the magnetic resonance imaging equipment to generate a magnetic field which has a very uniform magnetic field strength of, for example, within 3 ppm, in a magnetic field space near the center of the magnetic field. Therefore, the superconducting magnet is designed at a high precision in correspondence with the requirement. In actuality, however, the uniformity of the magnetic field in the magnetic field space lowers due to a manufacturing dimensional error in a process for producing the superconducting magnet, the influence of a magnetic material existing around a place where the superconducting magnet is installed, and so forth.

For this reason, the superconducting magnet is additionally provided with a magnetic field adjustment device for making the fine adjustment of the magnetic field strength. The magnetic field adjustment device employs magnetic material shims made of a magnetic material of, for example, high permeability. The magnetic material shims serve to correct the disorder of the magnetic field strength of the static magnetic field generated by the superconducting magnet, and they are arranged and adjusted on the basis of the distribution evaluation of the magnetic field strength. More specifically, the magnetic material shims have a designative volume which is designated on the basis of the distribution evaluation of the magnetic field strength, and they are arranged at a designative position which is designated on the basis of the distribution evaluation. The disorder of the static magnetic field generated by the superconducting magnet is corrected with a magnetic field which is generated by the magnetization of the magnetic material shims, whereby a highly uniform magnetic field is obtained. Regarding the magnetic material shims, Patent Documents 1 (JP63-122441A, especially FIGS. 1 and 2 and their explanations), 2 (JP5-220127A, especially FIG. 2 and its explanation), and 3 (JP5-329128A) have been known.

FIGS. 1 and 2 of Patent Document 1 disclose a magnetic field strength correction device wherein a pair of protrusions are formed through leaf springs on both the sides of a holder for holding the magnetic material shims, and the holder is arranged at the predetermined position of a holding member by using the protrusions. Besides, FIG. 2 of Patent Document 2 discloses a magnet device wherein a slide plate is disposed between a pair of groove-shaped members, and the magnetic material shims are arranged on the slide plate, whereby the mounting position of the magnetic material shims can be freely set. Further, Patent Document 3 discloses a magnetic field correction device wherein a plurality of flat magnetic material members which are equal in length, thickness and width are formed with holes, so as to output a desired magnetic field correction component.

The techniques of Patent Documents 1 and 2 serve to set the mounting position of the magnetic material shims, and the technique of Patent Document 3 serves to adjust the magnetic field correction component of the magnetic material shims. In general, in a state where the superconducting magnet is excited to generate the static magnetic field, an intense electromagnetic force acts on the magnetic material shims, and hence, the magnetic material shims cannot be safely arranged and adjusted. Accordingly, the adjustment of the position of the magnetic material shims according to Patent Document 1 or 2 and the adjustment of the volume of the magnetic material according to Patent Document 3 are made in a state where the superconducting magnet is once deexcited. Thereafter, the superconducting magnet needs to be excited again for confirming the magnetic field strength. However, a long time, for example, about one hour is expended on each of the excitation and deexcitation of the superconducting magnet, and a time period of two hours or more is required for deexciting the superconducting magnet once and exciting it again. As another problem, in deexciting and exciting the superconducting magnet, large currents must be caused to flow through current leads made of a normal conductor. Joule heat is generated within the superconducting magnet by the large currents, and liquid helium is vaporized and decreased by the Joule heat.

SUMMARY OF THE INVENTION

This invention proposes a shim support guide jig for a magnetic field generation apparatus as can draw magnetic material shims out of the magnetic field generation apparatus and insert them thereinto in a state where a superconducting magnet generates a magnetic field.

Also, this invention proposes a magnetic field generation apparatus whose magnetic field strength can be adjusted using a shim support guide jig, in a state where a superconducting magnet generates a magnetic field.

Besides, this invention proposes a magnetic resonance imaging equipment which includes the magnetic field generation apparatus.

In addition, this invention proposes a magnetic field adjustment method for a magnetic field generation apparatus as adjusts the magnetic field of the magnetic field generation apparatus, in a state where a superconducting magnet generates a magnetic field.

Further, this invention proposes a magnetic field adjustment method for a magnetic resonance imaging equipment as employs the magnetic field adjustment method for the magnetic field generation apparatus.

A shim support guide jig for a magnetic field generation apparatus according to this invention concerns a shim support guide jig for a magnetic field generation apparatus including a superconducting magnet which is configured in the shape of a cylinder and which generates a magnetic field in its internal space, and a plurality of shim supports which are arranged in the internal space and which serve to accommodate therein magnetic material shims for adjusting a magnetic field strength of the magnetic field. The shim support guide jig includes a shim support guide pipe in which a guide passage for guiding a movement of the shim support is formed. Thus, the shim support designated among the plurality of shim supports is drawn out from the internal space through the guide passage, and the designated shim support is inserted into the internal space through the guide passage.

Besides, a magnetic field generation apparatus according to this invention includes a superconducting magnet which is configured in the shape of a cylinder and which generates a magnetic field in its internal space, and a plurality of shim supports which are arranged in the internal space and which serve to accommodate therein magnetic material shims for adjusting a magnetic field strength of the magnetic field. Here, the shim support designated among the plurality of shim supports has had the magnetic material shims arranged and adjusted in a state where it has been drawn out from the internal space via a guide passage formed in a shim support guide pipe of a shim support guide jig, and it has been thereafter inserted into the internal space via the guide passage.

Besides, a magnetic resonance imaging equipment according to this invention includes the magnetic field generation apparatus according to this invention, and it makes the magnetic resonance imaging diagnosis of a patient arranged in the internal space.

Besides, a magnetic field adjustment method for a magnetic field generation apparatus according to this invention concerns a magnetic field adjustment method for a magnetic field generation apparatus including a superconducting magnet which is configured in the shape of a cylinder and which generates a magnetic field in its internal space, and a plurality of shim supports which are arranged in the internal space and which serve to accommodate therein magnetic material shims for adjusting a magnetic field strength of the magnetic field. The magnetic field adjustment method here includes drawing out at least one shim support designated among the plurality of shim supports, from the internal space via a guide passage formed in a shim support guide pipe of a shim support guide jig; accommodating the magnetic material shims of designative volume at a designative position of the designated shim support; and inserting the designated shim support in which the magnetic material shims have been accommodated, into the internal space via the guide passage.

Further, a magnetic field adjustment method for a magnetic resonance imaging equipment according to this invention concerns a magnetic field adjustment method for a magnetic resonance imaging equipment which makes the magnetic resonance imaging diagnosis of a patient arranged in the internal space. The magnetic field adjustment method here employs the magnetic field adjustment method for the magnetic field generation apparatus according to this invention.

Owing to the use of the shim support guide jig according to this invention, in the state where the superconducting magnet has generated the magnetic field in the internal space, it is possible to draw out the designated shim support from the internal space to a place where the influence of the magnetic field becomes little, to perform the arrangement and adjustment of the magnetic material shims for the designated shim support in the place, and to insert the designated shim support into the internal space. Therefore, in the state where the superconducting magnet has generated the static magnetic field, the arrangement and adjustment of the magnetic material shims can be performed, and a time period required for the magnetic field adjustment can be shortened. Moreover, in the arrangement and adjustment of the magnetic material shims, the deexcitation and re-excitation of the superconducting magnet are dispensed with, and liquid helium can be prevented from decreasing due to its vaporization.

Besides, in the magnetic field generation apparatus according to this invention, at least one shim support designated among a plurality of shim supports has had the magnetic material shims arranged and adjusted in a state where it has been drawn out from an internal space via a guide passage formed in a shim support guide pipe of a shim support guide jig, and it has been thereafter inserted into the internal space via the guide passage. In a state where a superconducting magnet has generated a static magnetic field, the arrangement and adjustment of the magnetic material shims are performed, and hence, a time period required for a magnetic field adjustment is shortened. Moreover, in the arrangement and adjustment of the magnetic material shims, the deexcitation and re-excitation of the superconducting magnet are dispensed with, and liquid helium can be prevented from decreasing due to its vaporization.

Besides, the magnetic resonance imaging equipment according to this invention includes the magnetic field generation apparatus according to this invention, and it makes the magnetic resonance imaging diagnosis of a patient arranged in the internal space of a superconducting magnet. The magnetic field adjustment of the magnetic resonance imaging equipment can be performed in a state where the superconducting magnet has generated a magnetic field, and a time period required for a magnetic field adjustment can be shortened. Moreover, in the arrangement and adjustment of the magnetic material shims, the deexcitation and re-excitation of the superconducting magnet are dispensed with, and liquid helium can be prevented from decreasing due to its vaporization.

Besides, the magnetic field adjustment method for a magnetic field generation apparatus according to this invention includes drawing out at least one shim support designated among the plurality of shim supports, from the internal space via a guide passage formed in a shim support guide pipe of a shim support guide jig; accommodating the magnetic material shims of designative volume at a designative position of the designated shim support; and inserting the designated shim support in which the magnetic material shims have been accommodated, into the internal space via the guide passage. According to the magnetic field adjustment method for the magnetic field generation apparatus, the magnetic field adjustment based on the magnetic material shims can be performed in a state where a superconducting magnet has generated a magnetic field, and a time period required for a magnetic field adjustment can be shortened. Moreover, in the arrangement and adjustment of the magnetic material shims, the deexcitation and re-excitation of the superconducting magnet are dispensed with, and liquid helium can be prevented from decreasing due to its vaporization.

Further, the magnetic field adjustment method for a magnetic resonance imaging equipment according to this invention consists in a magnetic field adjustment method for a magnetic resonance imaging equipment which makes a magnetic resonance imaging diagnosis of a patient arranged in an internal space of a superconducting magnet, wherein a magnetic field adjustment is performed by employing the magnetic field adjustment method for the magnetic field generation apparatus according to this invention. According to the magnetic field adjustment method for the magnetic resonance imaging equipment, the arrangement and adjustment of the magnetic material shims can be performed in a state where the superconducting magnet has generated a magnetic field, and a time period required for a magnetic field adjustment can be shortened. Moreover, in the arrangement and adjustment of the magnetic material shims, the deexcitation and re-excitation of the superconducting magnet are dispensed with, and liquid helium can be prevented from decreasing due to its vaporization.

The foregoing and other objects, features, aspects and advantages of this invention will become more apparent from the following detailed description of this invention when taken in conjunction with the accompanying drawings.

BRIEF DESCRIPTION OF THE DRAWINGS

FIGS. 9(a) and 9(b) are a sectional view and a side view showing Embodiment 5 of the shim support guide jig according to this invention, respectively; and FIG. 10 is a perspective view showing a shim support which is used in combination with the shim support guide jig of Embodiment 5.

DESCRIPTION OF THE PREFERRED EMBODIMENTS

Now, several embodiments of this invention will be described with reference to the drawings.

Embodiment 1

Figure 1:
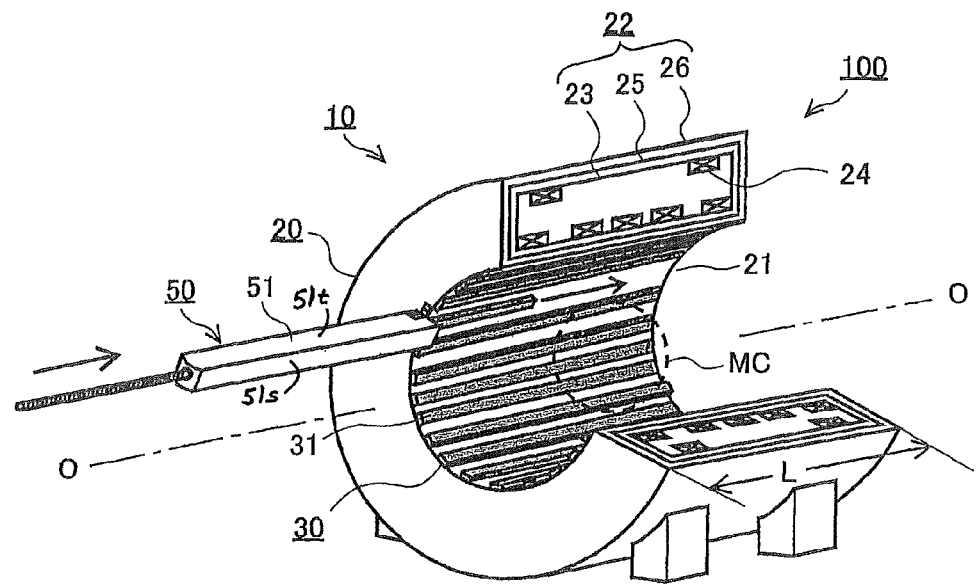
FIG. 1 is a perspective view, partly in section, showing a magnetic field adjustment state in Embodiment 1 of a magnetic resonance imaging equipment according to this invention.
Figure 2:
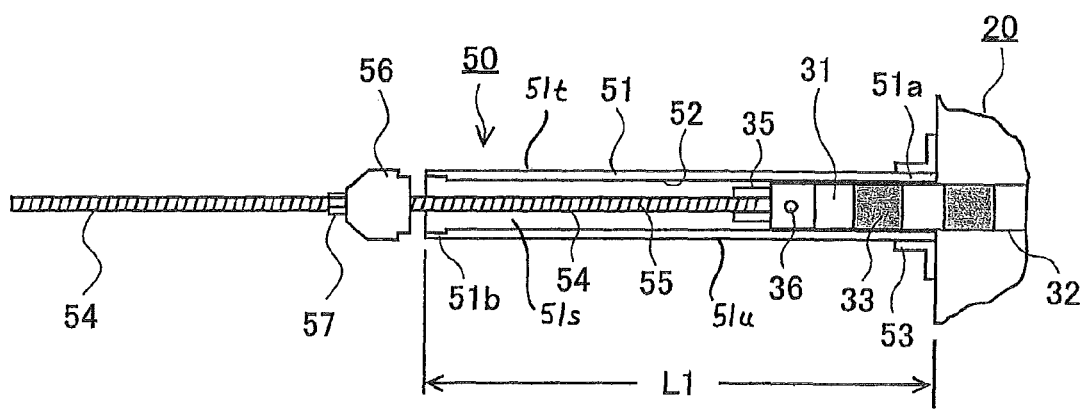
FIG. 2 is a sectional view showing Embodiment 1 of a shim support guide jig according to this invention.
Figure 3:
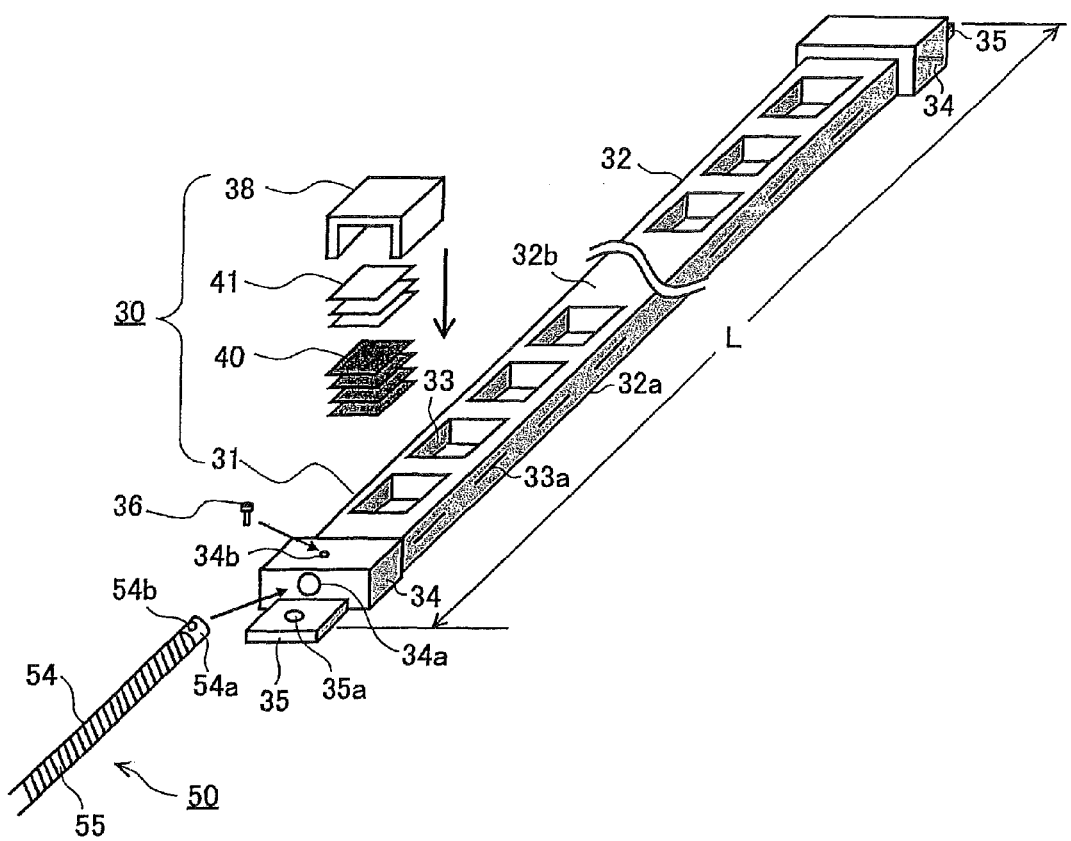
FIG. 3 is a perspective view showing the shim support guide jig and a shim support in Embodiment 1.
Figure 4:
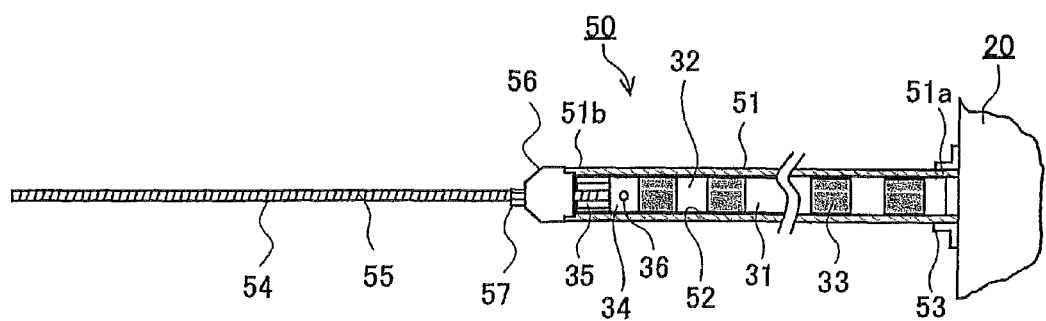
FIG. 4 is a sectional view showing a state where the shim support has been drawn out by the shim support guide jig in Embodiment 1.

FIG. 1 is a perspective view, partly in section, showing a magnetic field adjustment state in Embodiment 1 of a magnetic resonance imaging equipment according to this invention. FIG. 2 is a sectional view showing Embodiment 1 of a shim support guide jig according to this invention. FIG. 3 is a perspective view showing the shim support guide jig according to Embodiment 1 and a shim support. FIG. 4 is a sectional view showing a state where the shim support has been drawn out by the shim support guide jig according to Embodiment 1.

A magnetic resonance imaging equipment 100 in Embodiment 1 as shown in FIG. 1 includes Embodiment 1 of a magnetic field generation apparatus according to this invention, and Embodiment 1 of a shim support guide jig according to this invention. The magnetic field generation apparatus in Embodiment 1 is indicated at numeral 10, and the shim support guide jig in Embodiment 1 is indicated at numeral 50.

As shown in FIG. 1, the magnetic field generation apparatus 10 includes a superconducting magnet 20, and a magnetic field adjustment device 30. The superconducting magnet 20 is configured substantially in the shape of a cylinder, but it is partly cut away and is illustrated in FIG. 1 for better understanding of its internal configuration. The superconducting magnet 20 is configured in the cylindrical shape around a center axis O-O, it has an internal space 21 inside, and it generates a static magnetic field M in the internal space 21. A magnetic field of high uniformity is required especially in a magnetic field space MC which is the central part of the static magnetic field M. The length of the internal space 21 in a direction parallel to the center axis O-O is denoted by letter L.

Since the superconducting magnet 20 is well known, the structure thereof will be briefly explained. The superconducting magnet 20 includes a low-temperature container 22 which is configured in the shape of a cylinder. The low-temperature container 22 is configured of a helium tank 23, a thermal shield tank 25 and a vacuum tank 26. The helium tank 23 is configured in the shape of a cylinder, and a plurality of superconducting coils 24 are accommodated in the helium tank 23, together with liquid helium. Each of the superconducting coils 24 is configured by winding a superconducting wire material whose superconductor is, for example, niobium titanate (NbTi), and the liquid helium is accommodated as a coolant in order to hold the superconducting coil 24 in a superconducting state. The thermal shield tank 25 intercepts external heat invading into the helium tank 23, and it is configured in the shape of a cylinder so as to cover the outer surface of the helium tank 23. The vacuum tank 26 is configured in the shape of a cylinder so as to further cover the outer surface of the thermal shield tank 25, and the interior thereof is held in a vacuum state. Incidentally, a refrigerator (not shown) is often connected to the low-temperature container 22 in order to suppress the consumption of the liquid helium within the helium tank 23.

The magnetic field adjustment device 30 is arranged on the inner peripheral surface of the superconducting magnet 20, and it corrects the magnetic field strength of the static magnetic field M generated in the internal space 21 by the superconducting magnet 20. This magnetic field adjustment device 30 includes a plurality of shim supports 31 arranged on the inner peripheral surface of the superconducting magnet 20, and magnetic material shims 40 necessary for the correction of the static magnetic field M. The magnetic material shims 40 are accommodated within each of the shim supports 31 and are not shown in FIG. 1, but they will be described with reference to FIG. 3 later.

The plurality of shim supports 31 are arranged on the inner peripheral surface of the superconducting magnet 20. The respective shim supports 31 are fixed at the predetermined positions (PP) of the inner peripheral surface of the superconducting magnet 20 in parallel with the center axis O-O, and at equal peripheral intervals to one another. The length L of each shim support 31 is substantially equal to the axial length L of the inner peripheral surface of the superconducting magnet 20. At the predetermined positions (PP), the corresponding shim supports 31 lie in touch with the inner peripheral surface of the superconducting magnet 20 over the full lengths L thereof. Each shim support 31 serves to accommodate the magnetic material shims 40 for correcting the magnetic field strength of the static magnetic field M.

The distribution of magnetic field strengths in the magnetic field space MC is evaluated in a state where the superconducting magnet 20 has generated the static magnetic field M. In order to correct the static magnetic field M, the arrangement of the magnetic material shims 40 is determined on the basis of the evaluation. Concretely, among the plurality of shim supports 31, at least one shim support 31 for accommodating the magnetic material shims 40 therein is designated. In addition, a position for accommodating the magnetic material shims 40 thereat, and the volume of the magnetic material shims 40 are designated for the designated shim support 31. The designated accommodation position of the magnetic material shims 40 shall be called the "designative position (DP)", and the designated volume of the magnetic material shims 40 shall be called the "designative volume (DV)". In a case where two or more shim supports 31 for accommodating the magnetic material shims 40 therein are designated among the plurality of shim supports 31, the designative positions (DP) are designated for the respective designated shim supports 31, and the designative volumes (DV) of the magnetic material shims 40 are designated in correspondence with the respective designative positions (DP).

Each of the plurality of shim supports 31 is configured as shown in FIG. 3. As seen from FIG. 3, each shim support 31 includes a shim tray 32, a pair of support end portions 34, and a shim holder 38. The shim tray 32 is configured of a belt-like body having a rectangular cross-section, and it extends to be elongate rectilinearly. The pair of support end portions 34 are configured unitarily with the shim tray 32, at both the end parts of the shim tray 32. The shim tray 32 and the support end portions 34 are unitarily made of a resin being a nonmagnetic material. Also the shim holder 38 is made of a resin being a nonmagnetic material.

The pair of support end portions 34 are unitarily formed with mounting plates 35, respectively. The shim support 31 is fixed to the predetermined position (PP) of the inner peripheral surface of the superconducting magnet 20 with a screw, not shown, by utilizing mounting holes 35a respectively formed in the pair of mounting plates 35. Each shim support 31 is fixed to the superconducting magnet 20 in such a manner that the rear surface 32a of the shim tray 32 touches the inner peripheral surface of the superconducting magnet 20. At the predetermined position (PP), the pair of mounting plates 35 are respectively located at both the end parts of the inner peripheral surface of the superconducting magnet 20, and the shim support 31 touches the inner peripheral surface of the superconducting magnet 20 over the full length L thereof.

In the front surface 32b of the shim tray 32, a plurality of shim pockets 33 are formed at equal intervals along the extending direction of this shim tray. The magnetic material shims 40 of the designative volume (DV) are accommodated in the shim pocket 33 corresponding to the designative position (DP), among the plurality of shim pockets 33. The magnetic material shims 40 are thin magnetic plates in a number corresponding to the designative volume (DV), and they are accommodated in the shim pocket 33 corresponding to the designative position (DP), together with thin shim spacers 41 made of a nonmagnetic material. The thin magnetic plates to constitute the magnetic material shims 40 are selected from among thin magnetic plates which are all equal in size and which have a plurality of sorts of thicknesses, and that number of magnetic plates which corresponds to the designative volume (DV) are selected. The shim spacers 41 are constituted by combining a required number of nonmagnetic plates each of which is equal in size to the magnetic material shim 40. The shim holder 38 covers the shim pocket 33 in which the magnetic material shims 40 and the shim spacers 41 are accommodated, and it holds the magnetic material shims 40 and the shim spacers 41. The shim holder 38 has both its end parts inserted into mounting holes 33a which correspond to the shim pocket 33 of the shim support 31, and it is thus mounted on the shim tray 32. The shim spacers 41 press the magnetic material shims 40 in the shim pocket 33 covered with the shim holder 38, thereby to restrain the magnetic material shims 40 from moving within the shim pocket 33.

Each of the pair of support end portions 34 of the shim support 31 is formed with a connecting hole 34a and a connection pin inserting hole 34b, and a connection pin 36 is inserted into the connection pin inserting hole 34b. In case of adjusting the magnetic field strength of the static magnetic field M, a shim support guide jig 50 is connected to the designated shim support 31 for which the arrangement and adjustment of the magnetic material shims 40 need to be performed, by using the connecting holes 34a, the connection pin inserting holes 34b and the connection pins 36. The shim support 31 to which the shim support guide jig 50 is connected, is designated on the basis of the distribution evaluation of the magnetic field strengths of the static magnetic field M.

As shown in FIG. 2, the shim support guide jig 50 includes a shim support guide pipe 51, a guide pipe fixing seat 53, a shim support connecting rod 54, a fixing lid 56 and a manipulating nut 57. This shim support guide jig 50 is used in the state where the superconducting magnet 20 has generated the static magnetic field M. Therefore, the shim support guide pipe 51, the guide pipe fixing seat 53, the shim support connecting rod 54, the fixing lid 56 and the manipulating nut 57 which constitute the shim support guide jig 50 are made of a nonmagnetic material of high rigidity so as not to be attracted by the static magnetic field M and to be deformed by the electromagnetic force of the static magnetic field M. A stainless steel material, for example, "SUS304", a glass epoxy resin, or the like is used as the nonmagnetic material of the high rigidity.

The shim support guide pipe 51 is a rectangular pipe of length "L1", and it has an inner guide passage 52 of rectangular section formed by upright side walls 51s, that are interconnected by a top wall 51t and a bottom wall 51u. This shim support guide pipe 51 includes an inner end portion 51a and an outer end portion 51b, and the guide passage 52 is formed in a manner to be continuous between the inner end portion 51a and the outer end portion 51b. The guide passage 52 is open in the inner end portion 51a, and the shim support guide pipe 51 is fixed to the superconducting magnet 20 by the guide pipe fixing seat 53 so that the guide passage 52 may oppose to the designated shim support 31 for which the arrangement and adjustment of the magnetic material shims 40 are required.

The guide pipe fixing seat 53 is mounted on the outer periphery of the inner end portion 51a of the shim support guide pipe 51. The guide pipe fixing seat 53 is fixed to the inner periphery of the end face of the superconducting magnet 20 by employing, for example, a screw or a dual-side adhesive tape, thereby to fix the shim support guide pipe 51 to the superconducting magnet 20. Owing to the guide pipe fixing seat 53, the operation of fixing the shim support guide pipe 51 to the superconducting magnet 20 is performed in the state where the superconducting magnet 20 has generated the static magnetic field M. On this occasion, both the shim support guide pipe 51 and the guide pipe fixing seat 53 are made of the nonmagnetic materials, and they are not attracted by the electromagnetic force of the static magnetic field M. Therefore, the shim support guide pipe 51 can be easily fixed to the end part of the designated shim support 31.

The shim support 31 is inserted into the guide passage 52, and it is passed through the guide passage 52 and is moved along this guide passage 52. The guide passage 52 guides the movement of the shim support 31. Although the guide passage 52 is a vacant space, it has a rectangular cross-section, the size of which is set at a size allowing the movement of the shim support 31. However, the size of the section of the guide passage 52 is adapted to hinder the shim support 31 from rotating within the guide passage 52, and to hinder the shim holder 38 from coming off during the movement of the shim support 31 within the guide passage 52. When the shim holder 38 comes off during the movement of the shim support 31 along the guide passage 52, the magnetic material shims 40 accommodated in the shim pocket 33 scatter. Therefore, the guide passage 52 guides the movement of the shim support 31 while hindering the shim holder 38 from coming off.

The shim support connecting rod 54 is a slender rod of circular cross-section, and the inner end portion 54a thereof is formed with a connection pin inserting hole 54b as shown in FIG. 3. The inner end portion 54a of the shim support connecting rod 54 is inserted into the connecting hole 34a which is formed in one support end portion 34 of the shim support 31. In this state, the connection pin 36 is inserted into both the connection pin inserting hole 34b and the connection pin inserting hole 54b, whereby the shim support connecting rod 54 is connected to the shim support 31. The connection pin 36 connects the shim support 31 and the shim support connecting rod 54, and it simultaneously hinders the shim support connecting rod 54 from rotating relative to the shim support 31.

The shim support connecting rod 54 is passed through the guide passage 52 of the shim support guide pipe 51, and is connected to the shim tray 32 of the shim support 31 by the connection pin 36. Also the operation of connecting the shim support connecting rod 54 and the shim tray 32 is performed in the state where the superconducting magnet 20 has generated the static magnetic field M. Since the shim support connecting rod 54 is also made of a nonmagnetic material, the electromagnetic force of the static magnetic field M does not act on the shim support connecting rod 54, and also the connecting operation can be easily executed.

The outer periphery of the shim support connecting rod 54 is formed with a screw 55. The screw 55 is a male screw, which is formed substantially over the full length of the shim support connecting rod 54. Concretely, the screw 55 is continuously formed over the full length of the shim support connecting rod 54, except the inner end portion 54a thereof.

The fixing lid 56 is arranged at the outer end portion 51b of the shim support guide pipe 51. This fixing lid 56 is pressed into the shim support guide pipe 51 in a manner to close the guide passage 52, at the outer end portion 51b of the shim support guide pipe 51, thereby to be fixed to the shim support guide pipe 51. The manipulating nut 57 is rotatably supported at the inner periphery of the outer end part of the fixing lid 56. The inner periphery of the manipulating nut 57 is formed with a female screw, and the manipulating nut 57 is threadably engaged with the screw 55 of the shim support connecting rod 54. The manipulating nut 57 is manually rotated. However, the manipulating nut 57 can also be configured so as to be rotated by employing a motor or the like drive source.

Since the manipulating nut 57 is rotatably supported by the fixing lid 56, this manipulating nut 57 can be rotated in the state where the fixing lid 56 is supported by the outer end portion 51b of the shim support guide pipe 51. Since the manipulating nut 57 is held by the fixing lid 56, the screw 55 is fed on the basis of the rotation of the manipulating nut 57, and the shim support connecting rod 54 is moved along the extension line thereof, so that the shim support 31 can be moved together with the shim support connecting rod 54. The manipulating nut 57 is rotated in the direction of threadably proceeding toward the inner end portion 54a of the shim support connecting rod 54, whereby the shim support connecting rod 54 and the shim support 31 are passed through the guide passage 52 and are drawn out into the guide passage 52. The movements of the shim support connecting rod 54 and the shim support 31 are also performed in the state where the superconducting magnet 20 has generated the static magnetic field M. On this occasion, since the shim support 31 and the shim support connecting rod 54 are made of nonmagnetic materials, they do not undergo the electromagnetic force from the static magnetic field M, and they can be easily moved. FIG. 4 shows a state where the whole shim support 31 has been accommodated in the shim support guide pipe 51 by the rotation of the manipulating nut 57.

In the state shown in FIG. 4, the fixing lid 56 is detached from the shim support guide pipe 51, and the shim support 31 is drawn out from the outer end portion 51b of the shim support guide pipe 51. The length L1 of the shim support guide pipe 51 is made greater than the axial length L of the superconducting magnet 20. The length L of the shim support 31 is substantially equal to the axial length L of the superconducting magnet 20. Accordingly, the shim support guide pipe 51 can accommodate the whole shim support 31 therein.

In addition, the length L1 of the shim support guide pipe 51 is set at a length with which, in the state where the inner end portion 51a of this shim support guide pipe 51 is fixed to the superconducting magnet 20, the outer end portion 51b thereof is hardly influenced by the static magnetic field M generated by the superconducting magnet 20. Concretely, the length L1 of the shim support guide pipe 51 is set at about 1.5 meters, and the static magnetic field M hardly influences the shim support 31 drawn out from the outer end portion 51b of the shim support guide pipe 51. The arrangement and adjustment of the magnetic material shims 40 are performed in a place where the shim support 31 has been drawn out from the outer end portion 51b of the shim support guide pipe 51. In the arrangement and adjustment of the magnetic material shims 40, the shim holder 38 is detached, and the magnetic material shims 40, which correspond to the designative volume (DV), and the shim spacers 41 are accommodated in the shim pocket 33 corresponding to the designative position (DP). When the accommodation of the magnetic material shims 40 and the shim spacers 41 has been ended, the shim holder 38 is attached to the shim pocket 33 in which the magnetic material shims 40 and the shim spacers 41 have been accommodated.

After the arrangements and adjustments of the magnetic material shims 40 have been completed, the designated shim support 31 is inserted into the guide passage 52 from the outer end portion 51b of the shim support guide pipe 51 again. Subsequently to the shim support 31, the shim support connecting rod 54 connected thereto is inserted into the guide passage 52. The manipulating nut 57 held by the fixing lid 56 is threadably engaged with the shim support connecting rod 54. In a state where the fixing lid 56 has been fixed to the outer end portion 51b of the shim support guide pipe 51 again, the manipulating screw 57 is rotated in the direction of threadably coming away from the inner end portion 54a of the shim support connecting rod 54, whereby the shim support connecting rod 54 and the shim support 31 can be moved toward the superconducting magnet 20. In a state where the shim support 31 has been inserted to the predetermined position (PP) at which the full length thereof touches the inner peripheral surface of the superconducting magnet 20, this shim support 31 is fixed to the inner peripheral surface of the superconducting magnet 20 by utilizing the mounting holes 35a of the mounting plates 35.

The magnetic field adjustment operation is carried out at an initial adjustment step after the superconducting magnet 20 has been first assembled into the magnetic resonance imaging equipment 100. Besides, at an inspection adjustment step after the operation of the magnetic resonance imaging equipment 100, the magnetic field adjustment operation is carried out if necessary. The initial adjustment step is performed in a state where the magnetic material shims 40 are not accommodated in any of the shim supports 31 of the magnetic field adjustment device 30. The inspection adjustment step is performed in a state where the magnetic material shims 40 of predetermined volume have been accommodated at the predetermined position of the predetermined shim support 31. At each of the initial adjustment step and the inspection adjustment step, a large number of magnetic field measurement means are first arranged in the magnetic field space MC, and the superconducting magnet 20 is thereafter excited to generate the static magnetic field M. In this state, the magnetic field strength distribution of the magnetic field space MC is measured, and the magnetic field uniformity of the distribution is evaluated. The magnetic field uniformity is evaluated in such a way that any error component is decomposed into a plurality of component terms by employing a well-known Legendre function expansion.

Concretely, the shim supporter 31 for which the magnetic material shims 40 are arranged and adjusted is designated, and the designative position (DP) for accommodating the magnetic material shims 40, and the designative volume (DV) corresponding to the designative position are determined, on the basis of the evaluation of the magnetic field uniformity. In the case where the plurality of shim supports 31 are designated and where the plurality of designative positions (DP) are designated for these shim supports 31, the designative volumes (DV) corresponding to the respective designative positions (DP) are determined. In the arrangement of the magnetic material shims 40, the designative position (DP) and designative volume (DV) of the magnetic material shims 40 are determined so that the respective component terms into which the error component has been decomposed may be made small, thereby to enhance the magnetic field uniformity. When the volume of the magnetic material shims 40 becomes excessively large, the magnetic field uniformity changes due to the change of an ambient temperature, and the actual manufacturing errors of the magnetic material shims 40 relative to the designed computational values thereof cumulate, to incur such a drawback that the magnetic field uniformity lowers. Therefore, the arrangement of the magnetic material shims 40 is determined so as to make the total volume of the magnetic material shims 40 as small as possible, and to satisfy any restriction for the total value of the respective component terms into which the error component has been decomposed in the evaluation of the magnetic field uniformity.

The initial adjustment step is executed in the state where the magnetic material shims 40 are not accommodated in any of the shim supports 31. At the initial adjustment step, the arrangement and adjustment of the magnetic material shims 40 are performed for the designated shim support 31. Concretely, the shim support guide jig 50 is arranged so as to oppose to the designated shim support 31 in which the magnetic material shims 40 are not accommodated, and the designated shim support 31 is drawn out from the outer end portion 51b of the shim support guide pipe 51 through the guide passage 52 by using this shim support guide jig 50. In the arrangement and adjustment of the magnetic material shims 40, the operation is performed in which the magnetic material shins 40 of the designative volume (DV) are accommodated in the shim pocket 33 of the designated shim support 31 as corresponds to the designative position (DP). The shim support 31 for which the arrangement and adjustment of the magnetic material shims 40 have ended, is inserted into the internal space 21 at the inner periphery of the superconducting magnet 20, through the guide passage 52 of the shim support guide pipe 51 again, and is fixed to the predetermined position (PP) by using the mounting plates 35.

In a case where, at the initial adjustment step, the arrangement and adjustment of the magnetic material shims 40 are necessary for any other shim support 31 in which the magnetic material shims 40 are not accommodated, the shim support guide jig 50 is subsequently arranged at a position opposing to the other shim support 31, and the arrangement and adjustment of the magnetic material shims 40 for the other shim support 31 are executed likewise to the above. In this way, at the initial adjustment step, the arrangements and adjustments of the magnetic material shims 40 are performed for all the shim supports 31 in which the magnetic material shims 40 need to be accommodated, by using the shim support guide jig 50 and in the state where the superconducting magnet 20 generates the static magnetic field M.

Besides, at the inspection adjustment step, the arrangement and adjustment of the magnetic material shims 40 are performed so as to correspond to the determined arrangement of the magnetic material shims 40, in other words, to the designative position (DP) and the designative volume (DV), and the adjustment operation of adjusting at least one of the accommodation position and accommodation volume of the magnetic material shims 40 is performed. The arrangement and adjustment of the magnetic material shims 40 are performed using the shim support guide jig 50, in the state where the superconducting magnet 20 generates the static magnetic field M. That is, the designated shim support 31 is drawn out, and the magnetic material shims 40 of the designative volume (DV) are accommodated at the designative position (DP), whereupon the shim support 31 is reinserted into the inner periphery of the superconducting magnet 20. Accordingly, the deexcitation and subsequent re-excitation of the superconducting magnet 20 need not be performed for the arrangement and adjustment of the magnetic material shims 40, and the superconducting magnet 20 continues the state where the static magnetic field M is generated.

In a case where, at the inspection adjustment step, the arrangement and adjustment of the magnetic material shims 40 are necessary for any other shim support 31, the shim support guide jig 50 is subsequently arranged at a position opposing to the other shim support 31, and the arrangement and adjustment of the magnetic material shims 40 for the other shim support 31 are executed likewise to the above. At the inspection adjustment step, the operation of merely removing the magnetic material shims 40 from the shim support 31 in which the magnetic material shims 40 of predetermined volume have been accommodated at a predetermined position is also performed on the basis of the distribution evaluation of the magnetic field strengths as may be needed. In this way, the arrangements and adjustments of the magnetic material shims 40 are performed for all the necessary shim supports 31, by using the shim support guide jig 50 and in the state where the superconducting magnet 20 generates the static magnetic field M.

When all the arrangements and adjustments of the magnetic material shims 40 have been completed, the distribution of the magnetic field strengths of the magnetic field space MC is measured to confirm the magnetic field uniformity of the magnetic field space MC again. If no problem exists in the result of the confirmation, the magnetic field adjustment operation is completed. If, as the result of the confirmation, the arrangement and adjustment of the magnetic material shims 40 are further judged to be necessary, they are repeated again by using the shim support guide jig 50. When the magnetic field adjustment operation has been completed, the magnetic field space MC in which the uniformity of the magnetic field strengths is high is attained, the shim support guide jig 50 is detached from the superconducting magnet 20, and the magnetic field generation apparatus 10 of the magnetic resonance imaging equipment 100 is run in the state where the shim support guide jig 50 has been detached. In the running state of the magnetic field generation apparatus 10, the designated shim support 31 of the magnetic field adjustment device 30 corrects the static magnetic field M generated by the superconducting magnet 20, and the uniform magnetic field required of the magnetic field space MC is generated.

Owing to the use of the shim support guide jig 50 in Embodiment 1, in the state where the superconducting magnet 20 has generated the magnetic field in the internal space 21, it is possible to draw out the designated shim support 31 from the internal space 21 to a place where the influence of the magnetic field becomes little, to perform the arrangement and adjustment of the magnetic material shims 40 for the designated shim support 31 in the place so as to accommodate the magnetic material shims 40 of the designative volume (DV) at the designative position (DP), and to insert the designated shim support 31 into the internal space 21. Therefore, in the state where the superconducting magnet 20 has generated the static magnetic field M, the arrangement and adjustment of the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Besides, in the magnetic field generation apparatus 10 in Embodiment 1, at least one designated shim support 31 among the plurality of shim supports 31 is subjected to the arrangement and adjustment of the magnetic material shims 40 in the state where it has been drawn out from the internal space 21 through the guide passage 52 formed inside the shim support guide pipe 51 of the shim support guide jig 50, and it is thereafter inserted into the internal space 21 through the guide passage 52. In this manner, the arrangement and adjustment of the magnetic material shims 40 are performed in the state where the superconducting magnet 20 has generated the magnetic field, so that a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Besides, the magnetic resonance imaging equipment 100 in Embodiment 1 includes the magnetic field generation apparatus 10 in Embodiment 1, and it makes the magnetic resonance imaging diagnosis of the patient arranged in the internal space 21. The magnetic field adjustment of the magnetic resonance imaging equipment 100 can be performed in the state where the superconducting magnet 20 has generated the magnetic field, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Besides, the magnetic field adjustment method for the magnetic field generation apparatus 10 in Embodiment 1 includes drawing out the designated shim support 31 among the plurality of shim supports 31, from the internal space 21 through the guide passage 52 formed inside the shim support guide pipe 51 of the shim support guide jig 50, inserting the magnetic material shims 40 of the designative volume (DV) into the designative position (DP) of the designated shim support 31, and inserting the designated shim support 31 in which the magnetic material shims 40 have been accommodated, into the internal space 21 through the guide passage 52. According to the magnetic field adjustment method for the magnetic field generation apparatus 10, in the state where the superconducting magnet 20 has generated the magnetic field, the magnetic field adjustment based on the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Further, the magnetic field adjustment method for the magnetic resonance imaging equipment 100 in Embodiment 1 is a magnetic field adjustment method for the magnetic resonance imaging equipment 100 which makes the magnetic resonance imaging diagnosis of the patient arranged in the internal space 21, in which the magnetic field adjustment is performed by employing the magnetic field adjustment method for the magnetic field generation apparatus 10 in Embodiment 1. According to the magnetic field adjustment method for the magnetic resonance imaging equipment 100, in the state where the superconducting magnet 20 has generated the static magnetic field M, the magnetic field adjustment based on the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

By the way, in the magnetic field generation apparatus 10 of the magnetic resonance imaging equipment 100 in Embodiment 1, the plurality of shim supports 31 have been assumed to be arranged at the predetermined positions (PP) of the inner peripheral surface of the superconducting magnet 20. It is also possible, however, to arrange a cylindrical shim support fixture on the inner peripheral surface of the superconducting magnet 20, and to arrange the plurality of shim supports 31 on the shim support fixture. Also in this case, the plurality of shim supports 31 are arranged at the predetermined position (PP) in parallel with the center axis O-O and at equal peripheral intervals to one another. In this case, in the state where the superconducting magnet 20 has generated the static magnetic field M, the shim support guide jig 50 draws out from the internal space 21, the designated shim support 31 among the plurality of shim supports 31 arranged on the shim support fixture, and it inserts the designated shim support 31 into the predetermined position (PP) of the shim support fixture again after the arrangement and adjustment of the magnetic material shims 40 have been performed.

Embodiment 2

Figure 5:
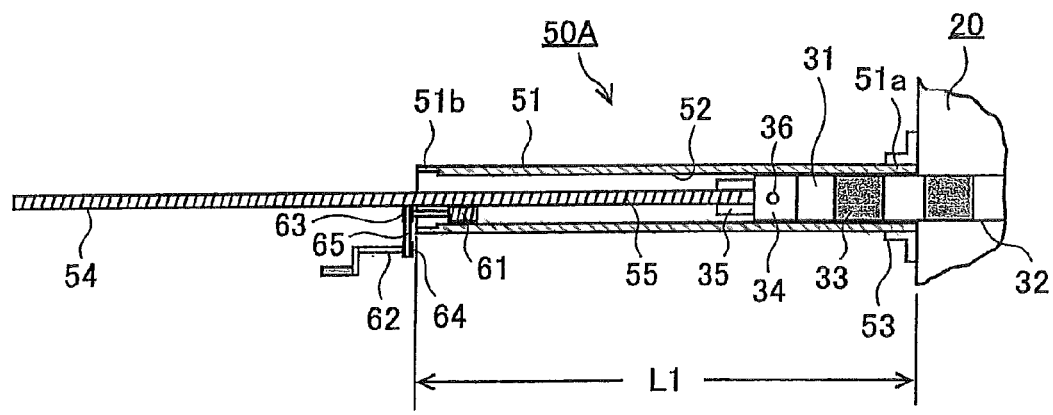
FIG. 5 is a sectional view showing Embodiment 2 of the shim support guide jig according to this invention.

FIG. 5 shows Embodiment 2 of the shim support guide jig according to this invention. The shim support guide jig 50A of Embodiment 2 shown in FIG. 5 is used instead of the shim support guide jig 50 of Embodiment 1 when the magnetic field adjustment of the magnetic field generation apparatus 10 is performed.

As compared with the shim support guide jig 50 of Embodiment 1 shown in FIG. 2, the shim support guide jig 50A of Embodiment 2 has removed the fixing lid 56 and the manipulating nut 57 in Embodiment 1, and it uses a manipulating gear 61 replacing the manipulating nut 57. A manipulating handle 62 is added to the manipulating gear 61, and it is connected to the manipulating gear 61 through pulleys 63 and 64 and a belt 65. The manipulating gear 61 is a worm gear which meshes with the screw 55 of a shim support connecting rod 54, and it is installed in the outer end portion 51*b* of a shim support guide pipe 51. This worm gear is not driven even when the large force of a shim support 31 has acted thereon. The manipulating gear 61 is arranged in parallel with the shim support connecting rod 54. The pulley 63 is coaxial with the manipulating gear 61, and the pulley 64 is coaxial with the manipulating handle 62. The remaining configuration is the same as in the shim support guide jig 50 of Embodiment 1.

The shim support 31 which is used in combination with the shim support guide jig 50A of Embodiment 2, has the same configuration as that of the shim support 31 shown in FIG. 3. The shim support connecting rod 54 is connected to one support end portion 34 of the shim support 31 by using the connection pin 36. The connection pin 36 connects the shim tray 32 and the shim support connecting rod 54, and prevents the shim support connecting rod 54 from rotating relative to the shim tray 32.

Likewise to the shim support guide jig 50 of Embodiment 1, the shim support guide jig 50A of Embodiment 2 is fixed to the inner periphery of the end part of the superconducting magnet 20 by the guide pipe fixing seat 53 so as to oppose to the designated shim support 31, in case of performing a magnetic field adjustment in the state where the superconducting magnet 20 has generated the static magnetic field M. With the shim support guide jig 50A, the manipulating handle 62 is manually rotated, thereby to drive the manipulating gear 61 and to move the shim support connecting rod 54. Thus, the designated shim support 31 can be drawn out through the guide passage 52.

With the shim support guide jig 50A of Embodiment 2, the shim tray 32 abuts against the manipulating gear 61 in a state where the whole designated shim support 31 has been drawn out into the guide passage 52 of the shim support guide pipe 51. In the state where the shim tray 32 abuts against the manipulating gear 61, the guide pipe fixing seat 53 is detached from the superconducting magnet 20, the shim support guide pipe 51 is moved to a place where the static magnetic field M influences little, and the shim support 31 is pulled out from the inner end portion 51*a* of the shim support guide pipe 51. Incidentally, when the shim support 31 is pulled out of the shim support guide pipe 51, the connection pin 36 needs to be detached. In this regard, the connection pin 36 can be easily detached by forming a connection pin taking-out window, not shown, in the vicinity of the manipulating gear 61 of the shim support guide pipe 51.

In the state where the designated shim support 31 has been taken out of the shim support guide pipe 51, the arrangement and adjustment of the magnetic material shims 40 are performed in the place of the little influence of the static magnetic field M. Thereafter, the shim support 31 for which the arrangement and adjustment of the magnetic material shims 40 have been ended is inserted from the inner end portion 51*a* into the shim support guide pipe 51 again, and this shim support guide pipe 51 is fixed again to a position corresponding to a position where the designated shim support 31 was fixed by the guide pipe fixing seat 53. After the shim support 31 has been connected with the shim support connecting rod 54 by the connection pin 36, the manipulating handle 62 is manually rotated, thereby to feed the shim support connecting rod 54, to insert the shim support 31 into the internal space 21 and to fix this shim support 31 to the predetermined position (PP).

By the way, in the shim support guide jig 50A of Embodiment 2, the manipulating handle 62 can also be rotated by a motor or the like drive source without being manually manipulated. It is also possible that the screw 55 at the outer periphery of the shim support connecting rod 54 is replaced with a rack which is formed by arraying a large number of teeth, and that the manipulating gear 61 is correspondingly replaced with a pinion which meshes with the rack.

Owing to the use of the shim support guide jig 50A of Embodiment 2, likewise to the shim support guide jig 50 of Embodiment 1, it is permitted in the state where the superconducting magnet 20 has generated the magnetic field in the internal space 21, to draw out the designated shim support 31 from the internal space 21 to the place where the influence of the magnetic field becomes little, to perform the arrangement and adjustment of the magnetic material shims 40 for the designated shim support 31 in the place so as to accommodate the magnetic material shims 40 of the designative volume (DV) at the designative position (DP), and to insert the designated shim support 31 into the internal space 21. Therefore, in the state where the superconducting magnet 20 has generated the magnetic field, the arrangement and adjustment of the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Embodiment 3

Figure 6:
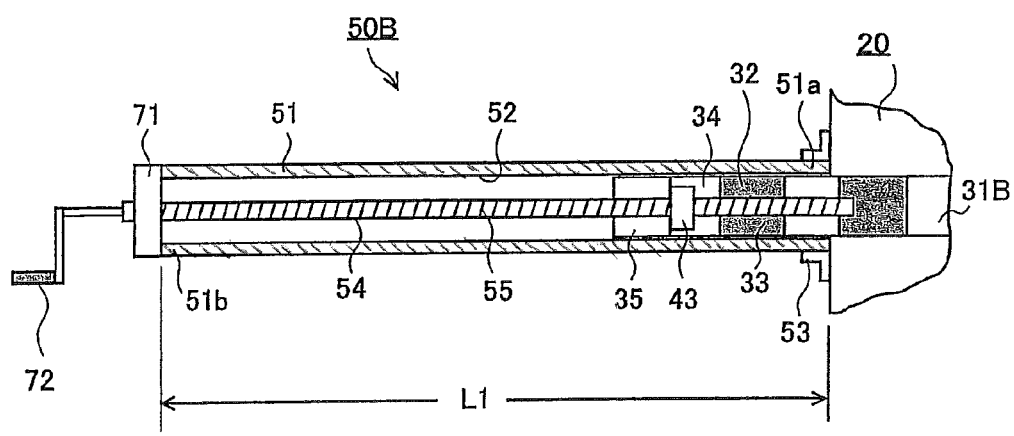
FIG. 6 is a sectional view showing Embodiment 3 of the shim support guide jig according to this invention.
Figure 7:
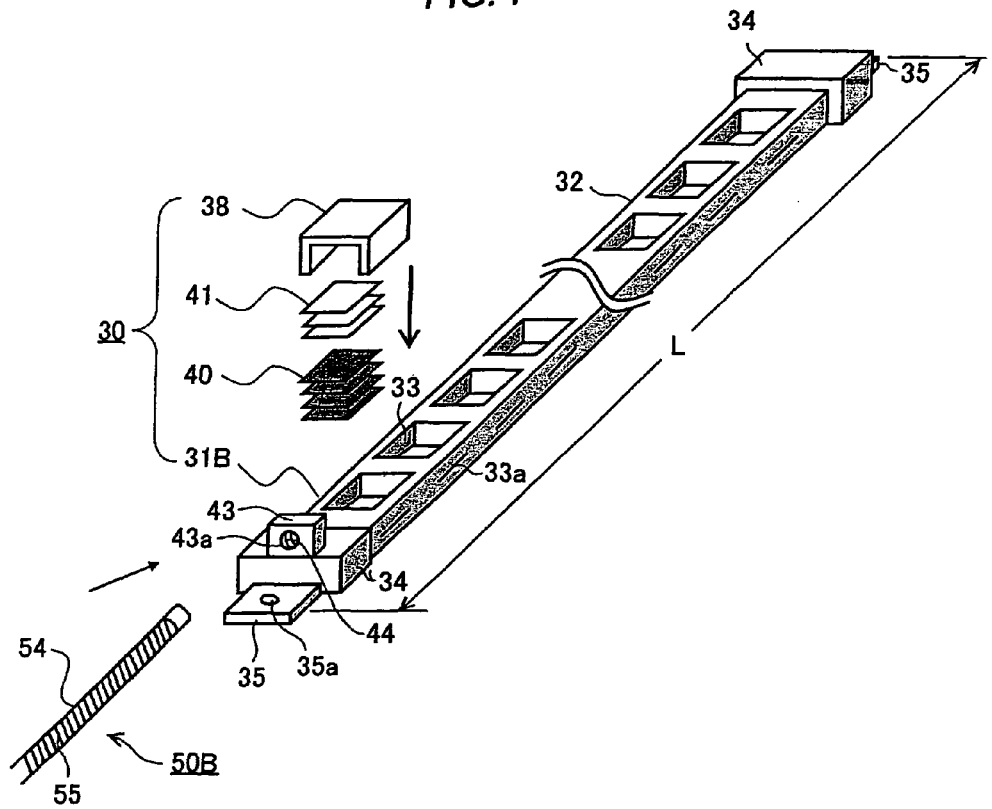
FIG. 7 is a perspective view showing the shim support guide jig and a shim support in Embodiment 3.

FIG. 6 shows Embodiment 3 of the shim support guide jig according to this invention, while FIG. 7 shows a shim support which is used in combination with the shim support guide jig of Embodiment 3. The shim support guide jig 50B of Embodiment 3 shown in FIG. 6 is used instead of the shim support guide jig 50 of Embodiment 1, and the shim support 31B shown in FIG. 7 is used instead of the shim support 31 of Embodiment 1. A plurality of shim supports 31B as shown in FIG. 7 are prepared, and they are arranged on the inner peripheral surface of a superconducting magnet 20, in parallel with a center axis O-O and at equal peripheral intervals.

As shown in FIG. 6, the shim support guide jig 50B of Embodiment 3 is such that a fixing lid 71 is detachably fixed to an outer end portion 51*b*, that a shim support connecting rod 54 is arranged so as to penetrate through the fixing lid 71, and that the outer periphery of the shim support connecting rod 54 is formed with a screw 55 in a manner to be continuous over the full length thereof. A manipulating handle 72 for rotating the shim support connecting rod 54 is arranged outside the fixing lid 71. The manipulating nut 57 as in the shim support guide jig 50 of Embodiment 1 is not arranged on the fixing lid 71. The remaining configuration is the same as in the shim support guide jig 50 of Embodiment 1.

As shown in FIG. 7, the shim support 31B which is used in combination with the shim support guide jig 50B includes a connector 43 in one support end portion 34. The connector 43 is formed in a manner to protrude on the front surface side of one support end portion 34. This connector 43 is made of a resin being a nonmagnetic material, unitarily with one support end portion 34. A screw hole 43a which extends in a direction parallel to the shim support connecting rod 54 is formed in the connector 43, and a female screw 44 with which the screw 55 at the outer periphery of the shim support connecting rod 54 is threadably engaged is formed in the connecting hole 43a. Except these points, the shim support 31B has the same configuration as that of the shim support 31 shown in FIG. 3.

Also the shim support guide jig 50B of Embodiment 3 is fixed to a position opposing to the designated shim support 31B, by the guide pipe fixing seat 53, in the state where the superconducting magnet 20 has generated the static magnetic field M. In the state where the shim support guide jig 50B is fixed, the manipulating handle 72 is manually rotated. Thus, the screw 55 of the shim support connecting rod 54 is threadably engaged with the female screw 44 formed in the connector 43 of the shim support 31B, thereby to connect the shim support connecting rod 54 and the shim support 31B. In this state, the manipulating handle 72 is further rotated, whereby the designated shim support 31B can be drawn out from the internal space 21 through the guide passage 52 of the shim support guide pipe 51.

When the fixing lid 71 is detached from the shim support guide pipe 51, the shim support 31B drawn out into the guide passage 52 is taken out from the outer end portion 51b in a state where it is connected with the shim support connecting rod 54. The outer end portion 51b of the shim support guide pipe 51 is located in a place where the influence of the static magnetic field M is little, and the arrangement and adjustment of the magnetic material shims 40 are performed in the place of the little influence of the static magnetic field M. Thereafter, the shim support 31B for which the arrangement and adjustment of the magnetic material shims 40 have been ended is inserted from the outer end portion 51b into the shim support guide pipe 51 again in the state where it is connected with the shim support connecting rod 54, and the fixing lid 71 is fixed to the outer end portion 51b. In this state, the manipulating handle 72 is manually rotated, thereby to feed the shim support connecting rod 54, to insert the shim support 31B into the internal space 21 and to fix this shim support 31B to the predetermined position (PP).

By the way, in the shim support guide jig 50B of Embodiment 3, the shim support connecting rod 54 can also be rotated by a motor or the like drive source without manually manipulating the manipulating handle 72.

Owing to the use of the shim support guide jig 50B of Embodiment 3, likewise to the shim support guide jig 50 of Embodiment 1, it is permitted in the state where the superconducting magnet 20 has generated the magnetic field in the internal space 21, to draw out the designated shim support 31B from the internal space 21 to the place where the influence of the magnetic field becomes little, to perform the arrangement and adjustment of the magnetic material shims 40 in the place so as to accommodate the magnetic material shims 40 of the designative volume (DV) at the designative position (DP) in the designated shim support 31B, and to insert the designated shim support 31B into the internal space 21. Therefore, in the state where the superconducting magnet 20 has generated the magnetic field, the arrangement and adjustment of the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Embodiment 4

Figure 8:
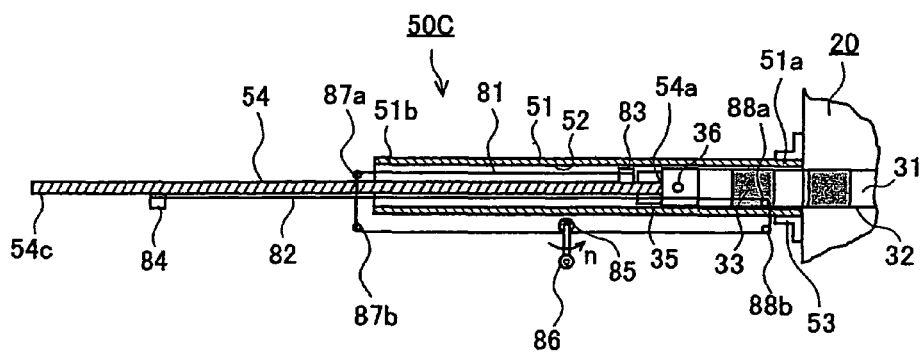
FIG. 8 is a sectional view showing Embodiment 4 of the shim support guide jig according to this invention.

FIG. 8 shows Embodiment 4 of the shim support guide jig according to this invention. The shim support guide jig 50C shown in FIG. 8 is used instead of the shim support guide jig 50 of Embodiment 1.

As shown in FIG. 8, the shim support guide jig 50C of Embodiment 4 is such that a wire mechanism 80 is included, and that a shim support 31 is moved through the guide passage 52 of a shim support guide pipe 51 by manipulating the wire mechanism 80. In the shim support guide jig 50C of Embodiment 4, a screw 55 is not formed at the outer periphery of a shim support connecting rod 54, and the fixing lid 56 and the manipulating nut 57 in the shim support guide jig 50 of Embodiment 1 are removed. Except these points, the shim support guide jig 50C has the same configuration as that of the shim support guide jig 50 of Embodiment 1. The shim support 31 has the same configuration as in Embodiment 1, and it is connected with the shim support connecting rod 54 by using the connection pin 36.

The wire mechanism 80 includes two wires 81 and 82, wire fixtures 83 and 84 which fix the respective wires 81 and 82 to the shim support connecting rod 54, and a reel 85 which winds the wires 81 and 82. The wire fixtures 83 and 84 are fixed to the shim support connecting rod 54. The wire fixture 83 is fixed to a position near the inner end portion 54a of the shim support connecting rod 54, and one end of the wire 81 is fixed to this wire fixture 83. The wire fixture 84 is fixed to a position near the outer end portion 54c of the shim support connecting rod 54, and one end of the wire 82 is fixed to the wire fixture 84. The reel 85 is arranged outside the shim support guide pipe 51, and this reel 85 is additionally provided with a manipulating handle 86. The wire 81 is wound in the direction of an arrow n by the reel 85 via pulleys 87a and 87b, and the wire 82 is wound in a direction opposite to the arrow n by the reel 85 via pulleys 88a and 88b.

The reel 85 is rotated by rotating the manipulating handle 86, whereby the shim support connecting rod 54 and the shim support 31 connected thereto are moved. When the reel 85 is rotated in the direction of the arrow n by the manipulating handle 86, the wire 81 is taken up on the reel 85 in the direction of the arrow n, and the wire 82 is simultaneously delivered. Owing to this manipulation, the shim support connecting rod 54 can be drawn out from the inner end portion 51a of the shim support guide pipe 51 toward the outer end portion 51b thereof. Besides, when the reel 85 is rotated in the direction opposite to the arrow n by the manipulating handle 86, the wire 82 is taken up on the reel 85 in the direction opposite to the arrow n, and the wire 81 is simultaneously delivered. Owing to this manipulation, the shim support connecting rod 54 can be inserted from the outer end portion 51b of the shim support guide pipe 51 toward the inner end portion 51a thereof.

Also the shim support guide jig 50C of Embodiment 4 is fixed to a position opposing to the designated shim support 31, by the guide pipe fixing seat 53, in the state where the superconducting magnet 20 has generated the static magnetic field M. In the state where the shim support guide jig 50C is fixed, the manipulating handle 86 is manually rotated to rotate the reel 85 in the direction of the arrow n. Thus, the designated shim support 31 can be drawn out from the internal space 21 through the guide passage 52 of the shim support guide pipe 51.

The shim support 31 drawn out into the guide passage 52 is taken out from the outer end portion 51b in a state where it is connected with the shim support connecting rod 54. The outer end portion 51b of the shim support guide pipe 51 is located in a place where the influence of the static magnetic field M is little, and the arrangement and adjustment of the magnetic material shims 40 are performed in the place of the little influence of the static magnetic field M. Thereafter, the shim support 31 for which the arrangement and adjustment of the magnetic material shims 40 have been ended is inserted from the outer end portion 51b into the shim support guide pipe 51 again in the state where it is connected with the shim support connecting rod 54. In this state, the manipulating handle 86 is manually rotated to rotate the reel 85 in the direction opposite to the arrow n. Thus, the shim support connecting rod 54 is fed so as to insert the shim support 31 into the internal space 21 and to fix this shim support 31 to the predetermined position (PP).

By the way, in the shim support guide jig 50C of Embodiment 4, the reel 85 can also be rotated by a motor or the like drive source without manually manipulating the manipulating handle 86.

Owing to the use of the shim support guide jig 50C of Embodiment 4, likewise to the shim support guide jig 50 of Embodiment 1, it is permitted in the state where the superconducting magnet 20 has generated the magnetic field in the internal space 21, to draw out the designated shim support 31 from the internal space 21 to the place where the influence of the magnetic field becomes little, to perform the arrangement and adjustment of the magnetic material shims 40 in the place so as to accommodate the magnetic material shims 40 of the designative volume (DV) at the designative position (DP) in the designated shim support 31, and to insert the designated shim support 31 into the internal space 21. Therefore, in the state where the superconducting magnet 20 has generated the magnetic field, the arrangement and adjustment of the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and the liquid helium can be prevented from decreasing due to its vaporization.

Embodiment 5

FIGS. 9(a) and 9(b) show Embodiment 5 of the shim support guide jig according to this invention, and FIG. 9(a) is a sectional view of the shim support guide jig, while FIG. 9(b) is a side view thereof. FIG. 10 shows a shim support 31D which is used in combination with the shim support guide jig 50D of Embodiment 5. The shim support guide jig 50D of Embodiment 5 shown in FIG. 9(a) (b) is used instead of the shim support guide jig 50 of Embodiment 1, and the shim support 31D shown in FIG. 10 is used instead of the shim support 31 of Embodiment 1. A plurality of shim supports 31D as shown in FIG. 10 are prepared, and they are fixed to predetermined positions (PP) at equal peripheral intervals and in parallel with a center axis O-O, on the inner peripheral surface of a superconducting magnet 20.

The shim support guide jig 50D of Embodiment 5 includes a cylindrical shim support guide pipe 51D. A female screw 90 is formed at the outer periphery of the guide passage 52 of the shim support guide pipe 51D. The female screw 90 is formed at the inner periphery of the shim support guide pipe 51D in a manner to be continuous from the inner end portion 51a of the shim support guide pipe 51D to the outer end portion 51b thereof. In the shim support guide jig 50D, the shim support connecting rod 54, fixing lid 56 and manipulating nut 57 in the shim support guide jig 50 of Embodiment 1 are removed. A guide pipe fixing seat 53 is fixed to the outer periphery of the inner end portion 51a of the shim support guide pipe 51D. When a magnetic field adjustment is performed, the shim support guide pipe 51D is fixed to the superconducting magnet 20 at a position opposing to the designated shim support 31D, by the guide pipe fixing seat 53.

As shown in FIG. 10, the shim support 31D is configured in the shape of a circular cylinder, the outer periphery of which is formed with a screw 45. The screw 45 is formed in a manner to be continuous over the full length of the shim support 31D. The shim support 31D is divided into a pair of semicylindrical support elements 31a and 31b, which are connected to each other by employing, for example, a hinge. The shim support 31D can assume two states; a closed state where the support elements 31a and 31b are closed to each other, and an open state where they are opened from each other. The shim support 31D is held in the closed state in the state where it is fixed to the predetermined position (PP) of the inner peripheral surface of the superconducting magnet 20, and in a state where it is moved. This shim support 31D is held in the open state when the arrangement and adjustment of magnetic material shims 40 are performed. A plurality of manipulating holes 46 into which a manipulating rod for manipulating the shim support 31D is fitted are formed in one end part of the shim support 31D.

The shim support 31D is formed with a plurality of shim pockets 33 in the extension direction thereof. Each shim pocket 33 is configured of a pocket 33a formed in the support element 31a, and a pocket 33b formed in the support element 31b. These pockets 33a and 33b are formed in opposition to each other. The magnetic material shims 40 and shim spacers 41 of nonmagnetic material are accommodated in the shim pocket 33 corresponding to a designative position (DP). The magnetic material shims 40 have a designative volume (DV), and they are accommodated in the pocket 33a. The shim spacers 41 are accommodated in the pocket 33b, and they press and hold the magnetic material shims 40 when the support elements 31a and 31b are held in the closed state.

Also the shim support guide jig 50D of Embodiment 5 is fixed to the position opposing to the designated shim support 31D, by the guide pipe fixing seat 53, in a state where the superconducting magnet 20 has generated a static magnetic field M. In the state where the shim support guide jig 50D is fixed, the manipulating rod not shown is passed through the guide passage 52 of the shim support guide pipe 51D, this manipulating rod is fitted into the manipulating holes 46 of the shim support 31D held in the closed state, and the screw 45 at the outer periphery of the shim support 31D is threadably engaged with the female screw 90 of the shim support guide pipe 51D. In this state, the shim support 31D is rotated by the manipulating rod. Thus, the designated shim support 31D can be drawn out from the internal space 21 of the superconducting magnet 20 through the guide passage 52 of the shim support guide pipe 51D.

The shim support 31D drawn out into the guide passage 52 is taken out from the outer end portion 51b of the shim support guide pipe 51D. The outer end portion 51b of the shim support guide pipe 51D is located in a place where the influence of the static magnetic field M is little. In the place of the little influence of the static magnetic field M, the support elements 31a and 31b of the shim support 31D are brought into the open state, and the arrangement and adjustment of the magnetic material shims 40 are performed. Thereafter, the shim support 31D for which the arrangement and adjustment of the magnetic material shims 40 have been ended and which have been brought into the closed state is inserted from the outer end portion 51b into the shim support guide pipe 51D again, and the screw 45 of the shim support 31D is threadably engaged with the female screw 90 of the shim support guide pipe 51D. In this state, the shim support 31D is threadably fed by the manipulating rod. Thus, the shim support 31D is inserted into the internal space 21 and is fixed to the predetermined position (PP).

Owing to the use of the shim support guide jig 50D of Embodiment 5, likewise to the shim support guide jig 50 of Embodiment 1, it is permitted in the state where the superconducting magnet 20 has generated the magnetic field in the internal space 21, to draw out the designated shim support 31D from the internal space 21 to the place where the influence of the magnetic field becomes little, to perform the arrangement and adjustment of the magnetic material shims 40 in the place so as to accommodate the magnetic material shims 40 of the designative volume (DV) at the designative position (DP), and to insert the designated shim support 31D into the internal space 21. Therefore, in the state where the superconducting magnet 20 has generated the magnetic field, the arrangement and adjustment of the magnetic material shims 40 can be performed, and a time period required for the magnetic field adjustment can be shortened. Moreover, in the arrangement and adjustment of the magnetic material shims 40, the deexcitation and re-excitation of the superconducting magnet 20 are dispensed with, and liquid helium can be prevented from decreasing due to its vaporization.

In the embodiments described above, the magnetic resonance imaging equipment according to this invention is used for making the imaging diagnosis of a patient. Besides, the magnetic field generation apparatus according to this invention can be used for, for example, the magnetic resonance imaging equipment. Further, the shim support guide jig according to this invention can be used when a magnetic field adjustment is performed in the magnetic field generation apparatus.

Various modifications and alterations of this invention will be apparent to those skilled in the art without departing from the scope and spirit of this invention, and it should be understood that this invention is not limited to the illustrative embodiments set forth herein.

What is claimed is:

1. A shim support guide jig configured for a magnetic field generation apparatus that is configured for a magnetic resonance imaging (MRI) environment, including a superconducting magnet which is configured in the shape of cylinder and which generates a magnetic field in its internal space, and a plurality of shim supports which are arranged in the internal space and which serve to accommodate therein magnetic material shims configured for adjusting a magnetic field strength of the magnetic field, wherein:

each of the plurality of shim supports includes a shim tray configured for accommodating the magnetic material shim, the shim tray comprising a belt-like body having a rectangular cross-section, and a shim holder in order to maintain the magnetic material shim in the shim tray, and wherein the shim tray is made of a nonmagnetic material, the shim support guide jig is constructed in order to draw out the designated shim support from among the plurality of shim supports in the internal space and constructed in order to insert the designated shim support into the internal space while the magnetic field is being generated, the shim support guide jig includes a shim support guide pipe made of nonmagnetic material and having a predetermined length, the shim support guide pipe has an outer end, an inner end configured to be fixed to the magnetic field generation apparatus in order to oppose the designated shim support, and a guide passage configured for guiding a movement of the shim tray of the designated shim support, the guide passage is formed on an inner peripheral surface of the shim support guide pipe and extends from the outer end to the inner end of the shim support guide pipe in order to draw out the shim tray of the designated shim support from the internal space through the guide passage and in order to insert the shim tray into the internal space through the guide passage, and the guide passage has, along substantially its entire length, a rectangular cross-section corresponding to that of the shim tray and sized in order to allow the movement of the shim tray within the guide passage and preventing rotation of the shim tray within the guide passage, the rectangular cross-section defined by two upright side walls interconnected by a top wall and a bottom wall.

2. The shim support guide jig configured for a magnetic field generation apparatus as defined in claim 1, further comprising wherein:

the shim support guide jig further includes a shim support connecting rod and a manipulating member, the shim support connecting rod is made of nonmagnetic material, and the shim support connecting rod is passed through the guide passage and is connected to the shim tray of the designated shim support;

the manipulating member is coupled to the shim support connecting rod in order to move the shim support connecting rod along the guide passage and wherein the designated shim support is drawn out from the internal space and is inserted into the internal space via the guide passage by movement of the shim support connecting rod.

3. The shim support guide jig configured for a magnetic field generation apparatus as defined in claim 2, wherein:

the shim support connecting rod is formed with a screw at its outer periphery; and the manipulating member is a nut which is threadably engaged with the screw wherein rotation of the nut produces movement of the rod along the guide passage.

4. The shim support guide jig configured for a magnetic field generation apparatus as defined in claim 2, wherein:

the shim support connecting rod is formed with a screw at its outer periphery; and the manipulating member is a manipulating gear which meshes with the screw, wherein rotation of the gear produces movement of the rod along the guide passage.

5. The shim support guide jig configured for a magnetic field generation apparatus as defined in claim 2, wherein the shim support connecting rod is formed with a rack at its outer periphery; and the manipulating member is a pinion which meshes with the rack wherein rotation of the pinion produces movement of the rod along the guide passage.

6. The shim support guide jig configured for a magnetic field generation apparatus as defined in claim 2, wherein:

each of the plurality of shim supports is formed with a screw hole;

the shim support connecting rod is formed with a screw at its outer periphery, the screw is threadably engaged with the screw hole in the designated shim support; and the manipulating member is a handle which rotates the shim support connecting rod in order to move the shim tray along the guide passage.

7. The shim support guide jig configured for a magnetic field generation apparatus as defined in claim 2, wherein the manipulating member is a wire attached to the shim support connecting rod at first and second longitudinally spaced attachment points, and a rotary reel for winding the wire in first and second directions, wherein the wire pulls the rod in a first direction at the first attachment point when the wire is wound in the first direction, and wherein the wire pulls the rod in a second direction at the second attachment point when the wire is wound in the second direction.

* * * * *